(12) United States Patent
Min et al.

(10) Patent No.: US 7,929,212 B2
(45) Date of Patent: Apr. 19, 2011

(54) IMAGE SENSOR HAVING MICRO LENSES ARRANGED IN DIFFERENT RATIOS ACCORDING TO LEFT SIDE AND RIGHT SIDE RATIOS

(75) Inventors: Dae Sung Min, Gyeonggi-Do (KR); Jung Soon Shin, Gyeonggi-do (KR)

(73) Assignee: Pixelplus Co., Ltd., Seongnam-si, Gyeonggi-do (KR)

( * ) Notice: Subject to any disclaimer, the term of this patent is extended or adjusted under 35 U.S.C. 154(b) by 600 days.

(21) Appl. No.: 11/914,346

(22) PCT Filed: Jun. 8, 2006

(86) PCT No.: PCT/KR2006/002189
§ 371 (c)(1),
(2), (4) Date: Nov. 13, 2007

(87) PCT Pub. No.: WO2006/132501
PCT Pub. Date: Dec. 14, 2006

(65) Prior Publication Data
US 2008/0266667 A1    Oct. 30, 2008

(30) Foreign Application Priority Data

Jun. 9, 2005  (KR) .......................... 10-2005-0049238

(51) Int. Cl.
*G02B 27/10* (2006.01)
(52) U.S. Cl. ....................................... 359/619; 359/626
(58) Field of Classification Search ........... 359/619–626
See application file for complete search history.

(56) References Cited

U.S. PATENT DOCUMENTS 6,724,425 B1 *  4/2004  Moon et al. ................... 348/272

FOREIGN PATENT DOCUMENTS

JP    2000349268    6/1999
(Continued)

OTHER PUBLICATIONS

International Search Report for corresponding International Application No. PCT/KR2006/002189 dated Sep. 21, 2006.

(Continued)

*Primary Examiner* — Jessica T Stultz
*Assistant Examiner* — Brandi N Thomas
(74) *Attorney, Agent, or Firm* — Kile Park Goekjian Reed & McManus PLLC

(57) ABSTRACT

There is provided an image sensor having micro lenses of which pitches decrease by different ratios according to left side and right side ratios, which are arranged in different ratios according to upper side and right side ratios, and of which pitches in the edge area are equal to a pixel pitch to arrange the micro lenses in a predetermined interval, thereby capable of preventing ambient sensitivity from deteriorating and suppressing crosstalk.

There is also provided an image sensor having micro lenses arranged in different ratios according to left side, right side, upper side and lower side ratios, which has photodiodes arranged in a predetermined interval and micro lenses for overlapping upper portions of the photodiodes to focus light thereon, wherein the micro lenses, in a first area (which is an area from the center area of the photodiodes to before the edge area), are arranged in predetermined shift ratios according to a distance to +X and −X directions or/and +Y and −Y directions and, in a second area (the edge area), are arranged in a shift ratio equal to a shift ratio of the last pixel of the first area. Accordingly, the smaller pixel size become, the less the photodiodes take their area. Besides, the lower the heights of the micro lenses are, the more the angle of light incident on the photodiodes increases. As a result, it is possible to reduce crosstalk and increase an ambient light.

8 Claims, 2 Drawing Sheets

FOREIGN PATENT DOCUMENTS

| | | | |
|---|---|---|---|
| JP | 2003-101888 | * | 4/2003 |
| JP | 2003101888 | | 4/2003 |
| KR | 1020030087471 A | | 11/2003 |
| KR | 1020050016071 A | | 2/2005 |

OTHER PUBLICATIONS

Written Opinion of the International Searching Authority for corresponding International Application No. PCT/KR2006/002189 dated Sep. 21, 2006.

* cited by examiner

[Fig. 1]
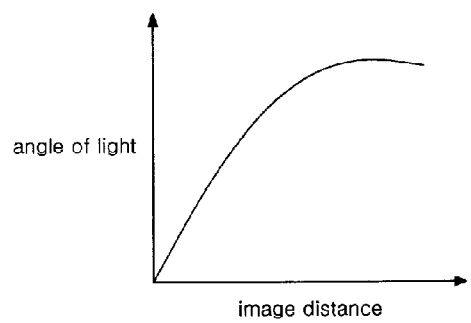
[Fig. 2]
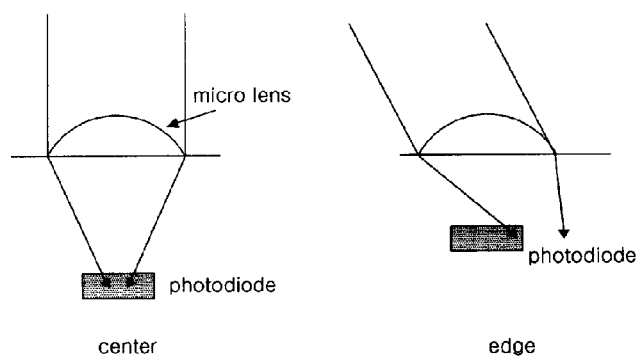
[Fig. 3]
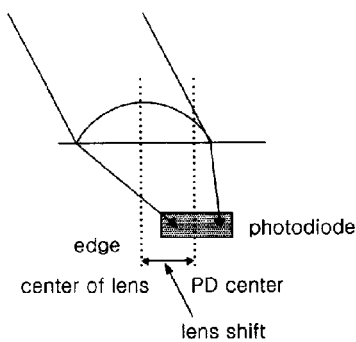
[Fig. 4]
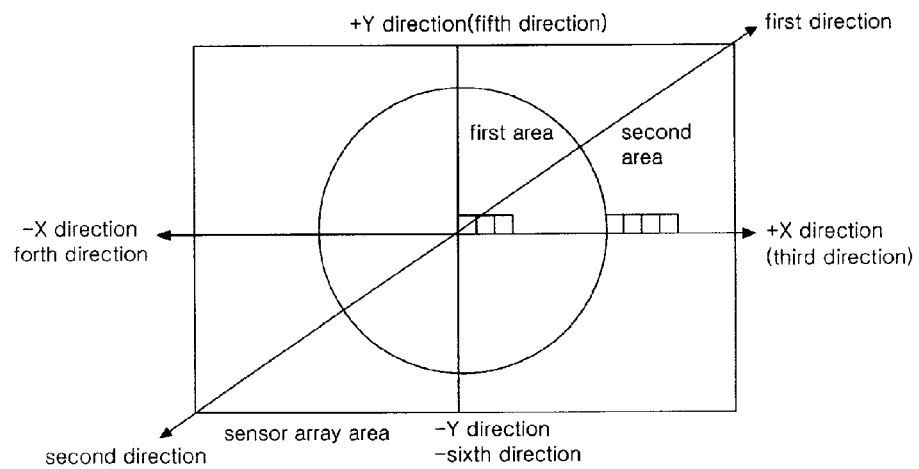

[Fig. 5]
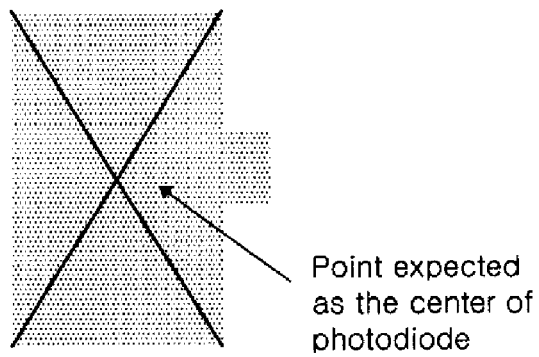
Point expected as the center of photodiode
[Fig. 6]
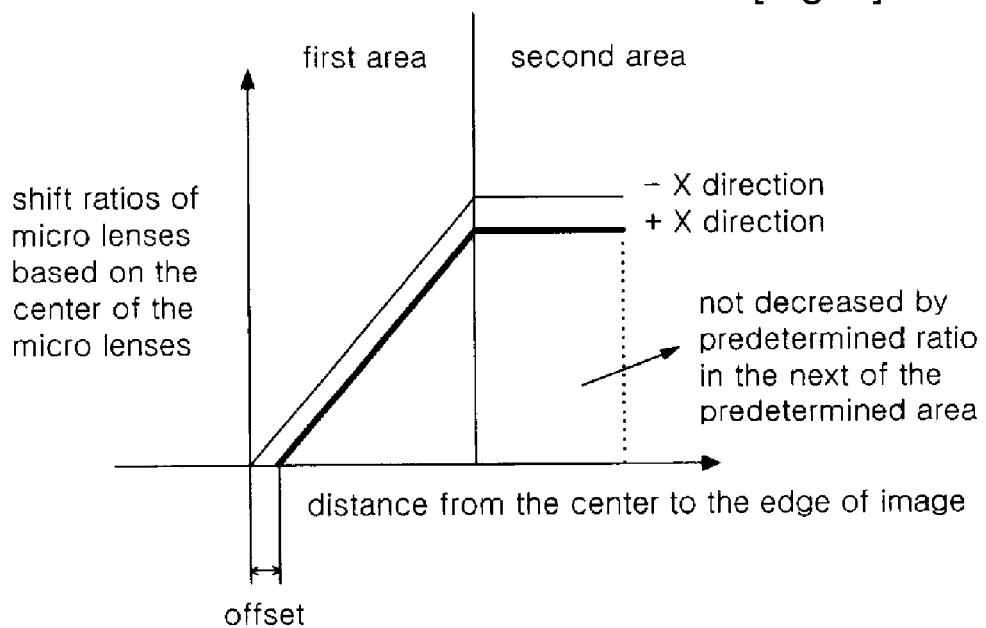
[Fig. 7]
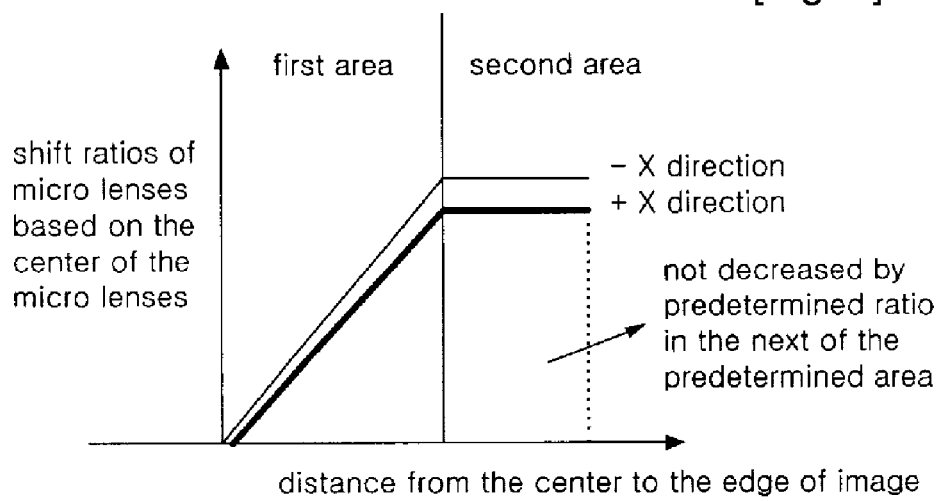

IMAGE SENSOR HAVING MICRO LENSES ARRANGED IN DIFFERENT RATIOS ACCORDING TO LEFT SIDE AND RIGHT SIDE RATIOS

TECHNICAL FIELD

The present invention relates to an image sensor, and more particularly, to a layout of micro lenses for focusing light incident through the micro lenses on photodiodes to increase light sensitivity.

BACKGROUND ART

FIG. 1 is a view showing change in an angle of light incident on a sensor through an external lens in a range from the center to the edge of a pixel area; In general, an angle of light increases linearly up to saturated angle, and after that, decreases in the edge area.

FIG. 2 is a view showing optical paths of light incident on the center area and on the edge area of the external lens.

When the centers of the micro lens and the photodiode are coincident with each other in the edge area, a focusing rate oh the photodiode decreases.

FIG. 3 is a view showing a shift state of a micro lens for focusing light incident on the micro lens on a photodiode in the edge area.

If the micro lens is not shifted so as to focus a light incident on the micro lens on the photodiode in the edge area, the incident light cannot be focused on the photodiode.

Besides, most optical lenses used in mobile phones are aspheric lenses. So the light with nonlinear ratio of angle of light to an image field is incident on the sensor.

In order to solve the problems, in production of micro lenses pitches of the micro lenses are designed to be smaller than a pixel pitch, so that the micro lenses in the edge area are shifted to the center direction of the photodiodes PD to focus light on the photodiodes.

DETAILED DESCRIPTION OF THE INVENTION

Technical Goal of the Invention

The present invention provides an image sensor having micro lenses of which pitches decrease by different ratios according to left side and right side ratios, which are arranged in different ratios according to upper side and right side ratios, and of which pitches in the edge area are the same as a pixel pitch to arrange the micro lenses in a predetermined interval, thereby capable of preventing ambient sensitivity from deteriorating and suppressing crosstalk as low as possible.

Disclosure of the Invention

According to an aspect of the present invention, there is provided an image sensor having photodiodes arranged in a predetermined interval and micro lenses arranged in different ratios according to left side, right side, upper side and lower side ratios to overlap upper portions of the photodiodes to focus light thereon, wherein the micro lenses, in a first area (which is an area from the center area of the photodiodes to before the edge area), are arranged in predetermined shift ratios according to a distance to +X and −X directions or/and +Y and −Y directions and, in a second area (the edge area), are arranged in shift ratio equal to a shift ratio of the last pixel of the first area.

According to an aspect of the present invention, there is provided an image sensor having photodiodes arranged in a predetermined interval and micro lenses arranged in different ratios according to left side, right side, upper side and lower side ratios to overlap upper portions of the photodiodes to focus light thereon, wherein the micro lenses, in a first area (which is an area from the center area of the photodiodes to before the edge area), are arranged in ratios of which gradients of the +X and −X directions are different from one another to adjust sensitivity of right and left sides and, in second area (the edge area), are arranged in a shift ratio equal to a shift ratio of the last pixel of the first area.

BRIEF DESCRIPTION OF THE DRAWINGS

FIG. 1 is a view showing an angle of light incident on a sensor through an external lens from a direction of the center of a pixel area to a direction of the edge;

FIG. 2 is a view showing optical paths of light incident on the center area and on the edge area of the external lens;

FIG. 3 is a view showing a shift state of a micro lens for focusing light incident on the micro lens on a photodiode in the edge area;

FIG. 4 is a view showing a layout of micro lenses arranged in different ratios according to left side, right side, upper side and lower side ratios according to an embodiment of the present invention;

FIG. 5 is a view showing an example of a photodiode having a shape of polygon of which line segments are more four;

FIG. 6 is a graph showing shift ratios of micro lenses based on the center of the micro lenses in a layout of micro lenses arranged in different ratios according to left side and right side ratios according to a first embodiment of the present invention; and FIG. 7 is a graph showing shift ratios of micro lenses based on the center of the micro lenses in a layout of micro lenses arranged in different ratios according to left side and right side ratios according to a second embodiment of the present invention.

BEST MODE FOR CARRYING OUT THE INVENTION

Now, exemplary embodiments according to the present invention will be described in detail with reference to the accompanying drawings.

FIG. 4 is a view showing a layout of micro lenses arranged in different ratios according to left side, right side, upper side and lower side ratios according to an embodiment of the present invention. FIG. 4 shows a layout of micro lenses in a first area which is an area from the center area of the photodiodes to before the edge area and in a second area which is the edge area.

If a pixel pitch is A*B, pitches of the micro lenses in the first area are smaller than A or B and decrease by predetermined ratios.

Here, the pitches of the micro lenses are different from each other according to +X, −X, +Y, and −Y directions (third, forth, fifth, and sixth directions respectively).

Pitches of the micro lenses in the second area are designed to be equal to the pixel pitch.

However, since the predetermined ratios are different from each other according to +X, −X, +Y, and −Y directions, even if the pitches of the micro lenses in the second area are equal to the pixel pitch, the micro lenses in the second area have different shift values from each other.

FIG. 5 is a view showing an example in which it is difficult to focus light through a micro lens on a photodiode having a shape of polygon.

In a case where it is difficult to adjust the light incident through the micro lens to the center of the photodiode having the shape of polygon, the centers of the micro lens and the photodiode are not coincident with each other and there is an offset having a predetermined value between the centers of the micro lens and the photodiode.

Therefore, the micro lenses in the first area are arranged in predetermined shift ratios which have the offset value, and a shift ratio of the second area is kept constant.

The reason why the shift ratio of the second area is kept constant is that an angle of light is saturated. Although the angle of light increases, the problem does not occur due to margins.

FIG. 6 is a graph showing shift ratios of micro lenses based on the center of the micro lenses in a layout of micro lenses arranged in different ratios according to left side, right side, upper side and lower side ratios according to a first embodiment of the present invention.

Pitches of the micro lenses in the first area have the predetermined offset which is an interval between the centers of the +X and −X directions, and are shifted by increasing shift ratios.

A shift ratio of the second area is equal to a shift ratio of the last pixel of the first area. Shift ratios of the +Y and −Y directions are designed in the same manner.

FIG. 7 is a graph showing shift ratios of micro lenses based on the center of the micro lenses in a layout of micro lenses arranged in different ratios according to left side, right side, upper side and lower side ratios according to a second embodiment of the present invention, showing that gradients of shift ratios of the +X and −X directions are different from one another.

In a case where shift ratios of the micro lenses are different from each other, in order to adjust sensitivity, the shift ratios of the +X and −X directions are different from one another, and a shift ratio in the second area is equal to the shift ratio of the last pixel of the first area. Shift ratios of the +Y and −Y directions are designed in the same manner.

According to the present invention, the smaller pixel size become, the less the photodiodes take their area. Besides, the lower the heights of the micro lenses are, the more the angle of light incident on the photodiodes increases. As a result, it is possible to reduce crosstalk and increase an ambient light.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An image sensor having photodiodes arranged in a predetermined interval and micro lenses arranged in different ratios according to left side, right side, upper side and lower side ratios to overlap upper portions of the photodiodes to focus light thereon, wherein the micro lenses,
   in a first area, which is an area from the center area of the photodiodes to before an edge area, are arranged in predetermined shift ratios according to a distance to +X and −X directions or/and +Y and −Y directions and,
   in a second area which is the edge area, are arranged in shift ratio equal to a shift ratio of the last pixel of the first area; and
   pitches of the micro lenses are smaller than a pixel pitch (A*B) in the +X and −X directions or/and +Y and −Y directions of the first area and decrease by a predetermined ratio.

2. The image sensor having micro lenses arranged in different ratios according to left side, right side, upper side and lower side ratios according to claim 1, wherein the shift ratios are different from each another in the +X and −X directions or/and +Y and −Y directions.

3. The image sensor having micro lenses arranged in different ratios according to left side, right side, upper side and lower side ratios according to claim 1, wherein the center of the micro lenses and the center of the photodiodes are not coincident each other, so that there is an offset in the +X and −X directions or/and +Y and −Y directions based on the center of the micro lenses.

4. The image sensor having micro lenses arranged in different ratios according to left side, right side, upper side and lower side ratios according to claim 1, wherein the pitches of the micro lenses are different from each other in the +X and −X directions or/and +Y and −Y directions of the first area.

5. The image sensor having micro lenses arranged in different ratios according to left side, right side, upper side and lower side ratios according to claim 1, wherein pitches of the micro lenses are equal to a pixel pitch in the +X and −X directions or/and +Y and −Y directions of the second area.

6. The image sensor having micro lenses arranged in different ratios according to left side, right side, upper side and lower side ratios according to claim 5, wherein the pitches of the micro lenses are different from each other in the +X and −X directions or/and +Y and −Y directions of the second area.

7. The image sensor having micro lenses arranged in different ratios according to left side, right side, upper side and lower side ratios according to claim 2, wherein pitches of the micro lenses are smaller than a pixel pitch (A*B) in the +X and −X directions or/and +Y and −Y directions of the first area and decrease by a predetermined ratio.

8. The image sensor having micro lenses arranged in different ratios according to left side, right side, upper side and lower side ratios according to claim 2, wherein pitches of the micro lenses are equal to a pixel pitch in the +X and −X directions or/and +Y and −Y directions of the second area.

* * * * *